(12) United States Patent
Onishi

(10) Patent No.: US 8,432,013 B2
(45) Date of Patent: Apr. 30, 2013

(54) SEMICONDUCTOR DEVICE AND A METHOD OF MANUFACTURING THE SAME

(75) Inventor: Yasuhiko Onishi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 188 days.

(21) Appl. No.: 13/019,359

(22) Filed: Feb. 2, 2011

(65) Prior Publication Data

US 2011/0204469 A1    Aug. 25, 2011

(30) Foreign Application Priority Data

Feb. 19, 2010    (JP) ................. 2010-034602

(51) Int. Cl.
  *H01L 29/78*    (2006.01)
(52) U.S. Cl.
  USPC .......................... 257/490; 438/454
(58) Field of Classification Search .......... 257/488, 257/490, 630, E21.383, E29.198; 438/218, 438/454

See application file for complete search history.

(56) References Cited

U.S. PATENT DOCUMENTS

2008/0169526 A1    7/2008    Wakimoto et al.

FOREIGN PATENT DOCUMENTS

| JP | 2008-193043 A | 8/2008 |
|----|---------------|--------|
| JP | 2009-117715 A | 5/2009 |

OTHER PUBLICATIONS

Translation of JP2009117715, published May 28, 2009.*

* cited by examiner

*Primary Examiner* — Thomas L Dickey
(74) *Attorney, Agent, or Firm* — Rossi, Kimms & McDowell LLP

(57) ABSTRACT

A semiconductor device is provided with a peripheral region that has a narrow width and exhibits good electric field relaxation and high robustness against induced charges. The device has an active region for main current flow and a peripheral region surrounding the active region on a principal surface of a semiconductor substrate of a first conductivity type. The peripheral region has a guard ring of a second conductivity type composed of straight sections and curved sections connecting the straight sections formed in a region of the principal surface surrounding the active region, and a pair of polysilicon field plates in a ring shape formed separately on inner and outer circumferential sides of the guard ring. The surface of the guard ring and the pair of polysilicon field plates of the inner circumferential side and the outer circumferential side are electrically connected with a metal film in the curved section.

18 Claims, 15 Drawing Sheets

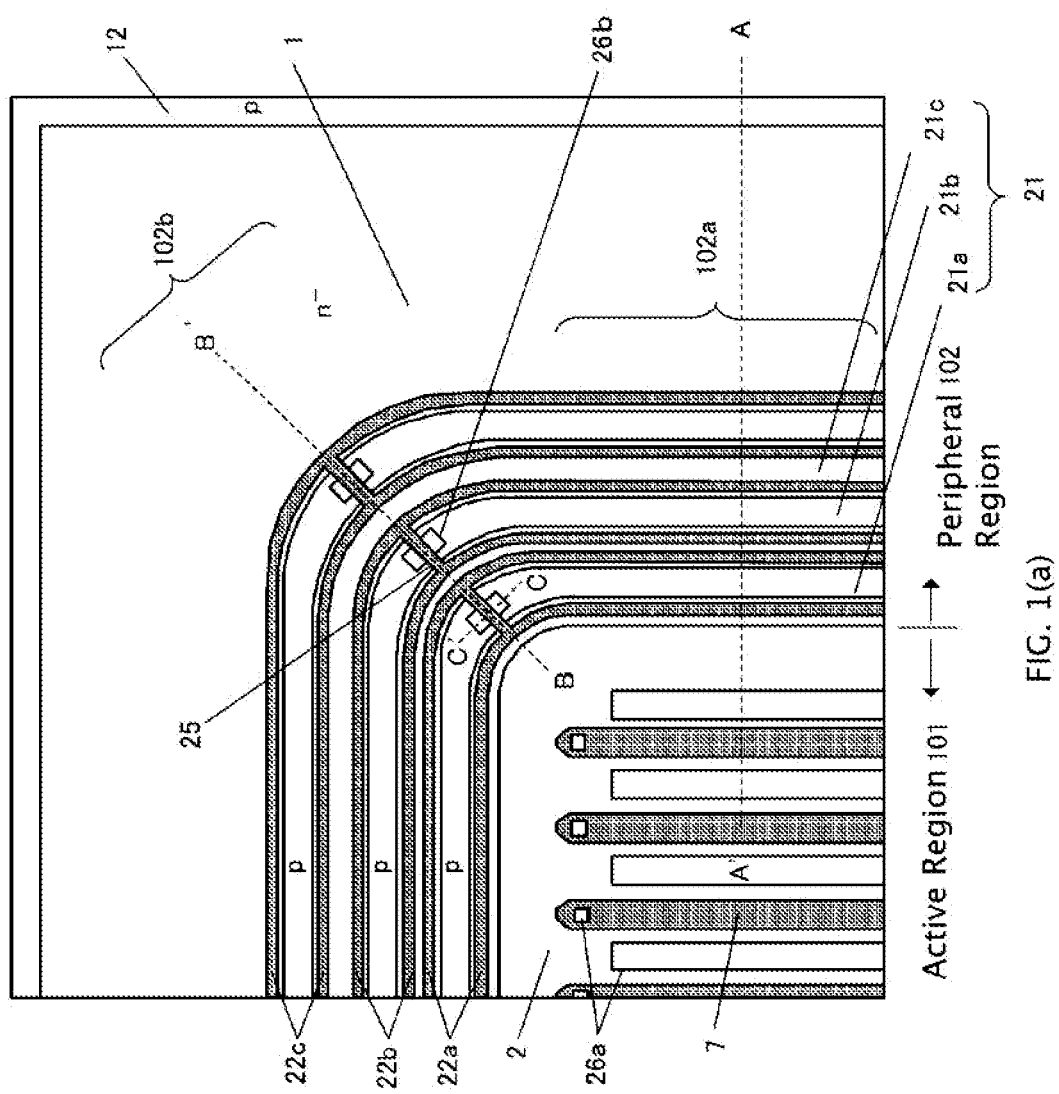
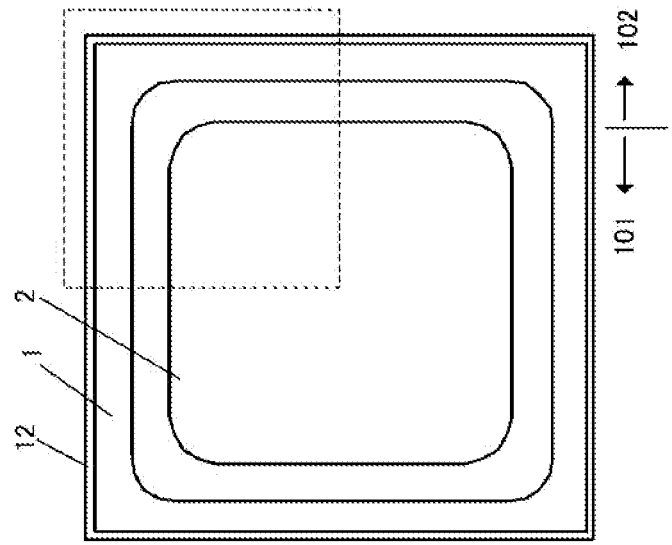
FIG. 1(a)
FIG. 1(b)

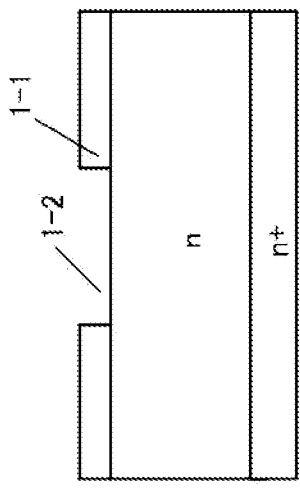
FIG. 7(a) Active Region 101
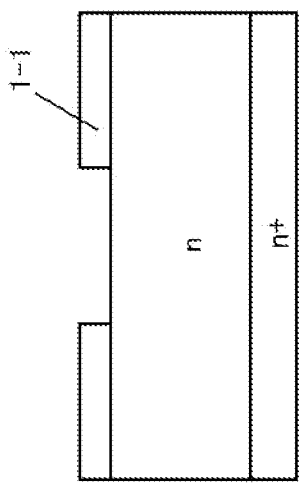
FIG. 7(b) Peripheral Region (Straight Section) 102a
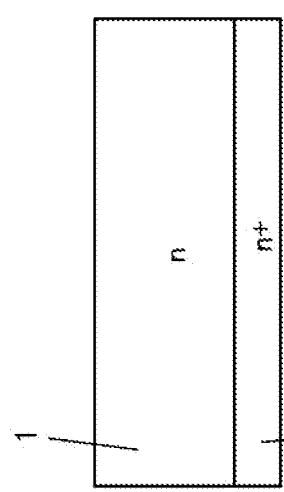
FIG. 7(c) Peripheral Region (Curved Section) 102b
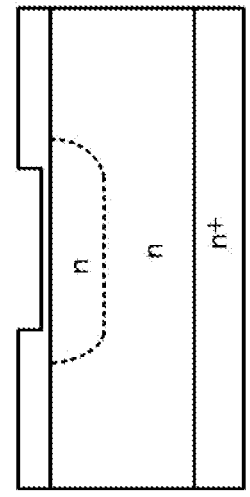
FIG. 8(a) Active Region 101
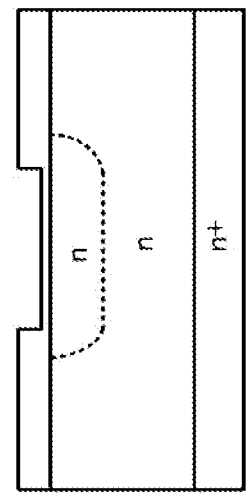
FIG. 8(b) Peripheral Region (Straight Section) 102a
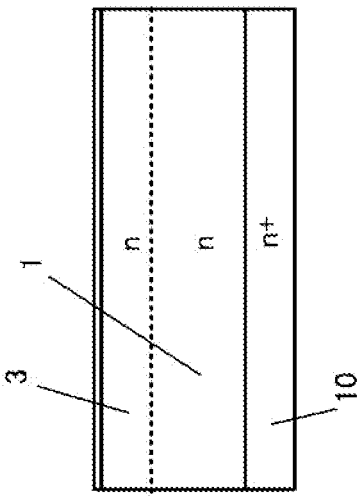
FIG. 8(c) Peripheral Region (Curved Section) 102b Active Region 101

Peripheral Region
(Straight Section) 102a

Peripheral Region
(Curved Section) 102b

Active Region 101

Peripheral Region
(Straight Section) 102a

Peripheral Region
(Curved Section) 102b

Peripheral Region 102b
(Curved Section)

Peripheral Region 102a
(Straight Section)

Active Region 101

Peripheral Region 102b
(Curved Section)

Peripheral Region 102a
(Straight Section)

Active Region 101

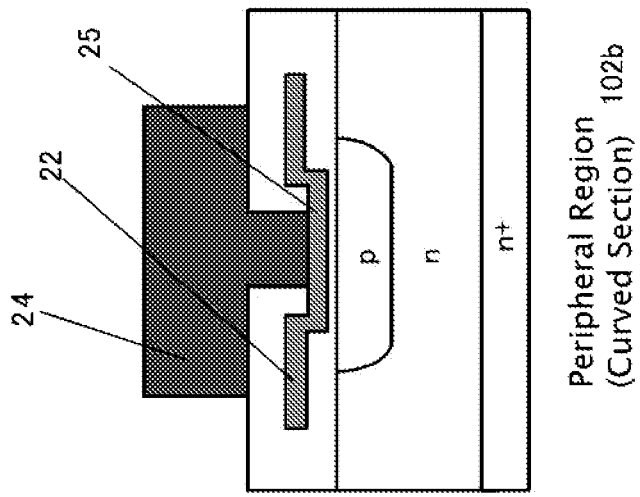
FIG. 13(c) Peripheral Region (Curved Section) 102b
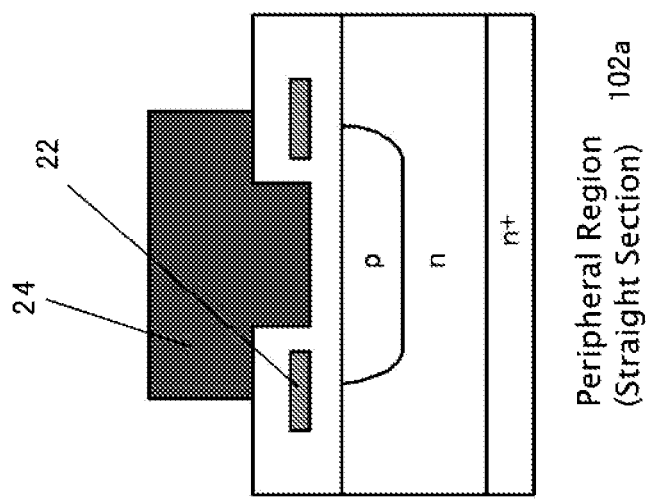
FIG. 13(b) Peripheral Region (Straight Section) 102a
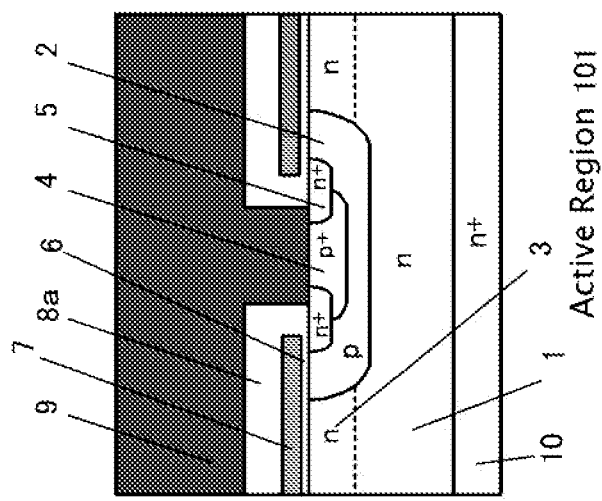
FIG. 13(a) Active Region 101

FIG. 16A
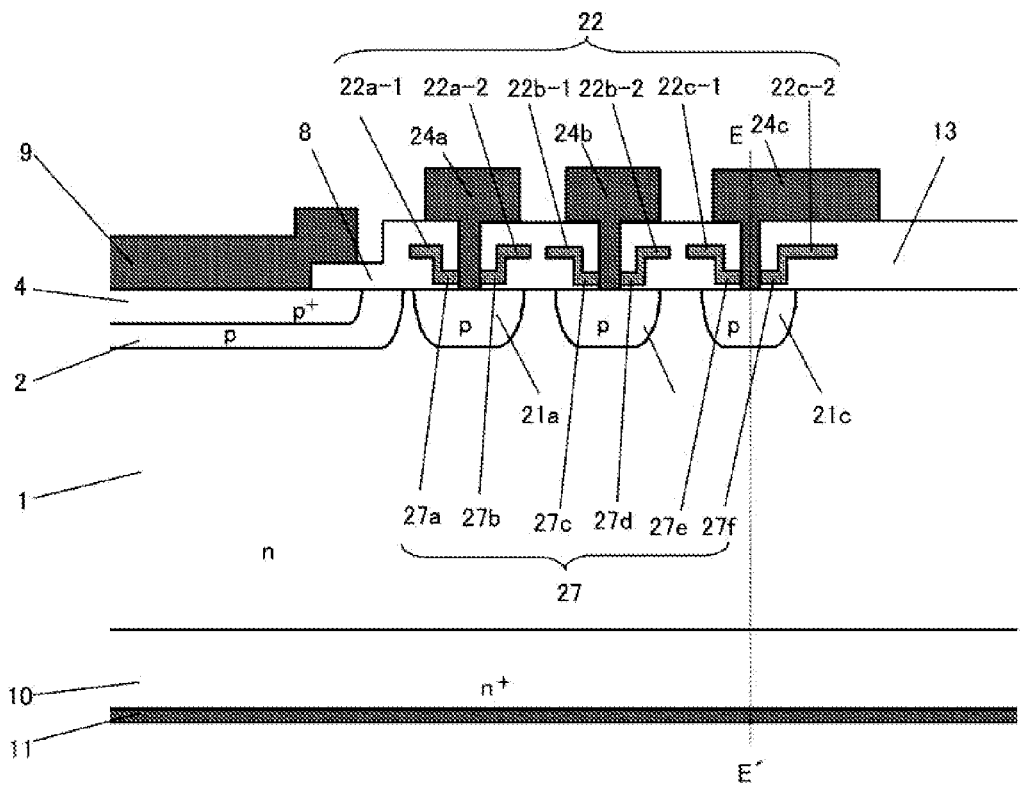
FIG. 16B
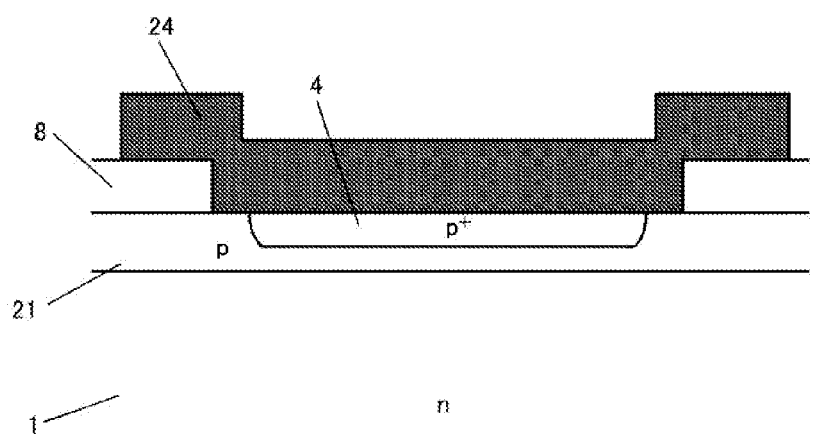
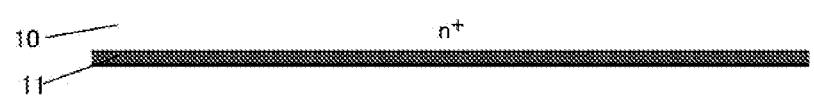

SEMICONDUCTOR DEVICE AND A METHOD OF MANUFACTURING THE SAME

BACKGROUND OF THE INVENTION

A. Field of the Invention

The present invention relates to a high voltage and high current capacity semiconductor device applicable to MOSFETs (metal oxide semiconductor field effect transistors), IGBTs (insulated gate bipolar transistors), bipolar transistors, diodes and the like. The invention also relates to a method of manufacturing such a semiconductor device.

B. Description of the Related Art

Semiconductor devices are generally classified into lateral semiconductor devices and vertical semiconductor devices. The former have electrodes on one surface of the semiconductor substrate and the main electric current flows along a principal surface. The latter have electrodes on the both surfaces and the main current flows between the electrodes on the both principal surfaces. In the vertical semiconductor device, the direction of the drift current flowing in the ON state is the same as the direction of depletion layer expansion due to a reverse biased voltage in the OFF state. In a conventional planar n channel vertical MOSFET, the high resistivity n-drift layer carries the drift current in the vertical direction in the ON state of the MOSFET, and is depleted in the OFF state to hold a breakdown voltage. Reducing a thickness of the high resistivity n-drift layer, that is, reducing the current path in the n-drift layer, leads to an effect of substantial ON resistance reduction of the MOSFET owing to the decreased resistance in the drift layer. Such a configuration, however, results in a narrowed width of the depletion layer that expands from a pn junction between the p base region and the n drift layer. Consequently, the electric field strength soon reaches the critical value of silicon, decreasing a breakdown voltage. On the other hand, a semiconductor device exhibiting a high breakdown voltage has a thick n-drift layer and causes a high ON resistance, which leads to an increased loss. This relationship between the ON resistance and the breakdown voltage is called a trade-off relationship. This trade-off relationship exists in semiconductor devices such as IGBTs, bipolar transistors, diodes and the like as well.

Meanwhile, in order to achieve a high breakdown voltage in a vertical semiconductor device, the device needs a peripheral region in a ring shape surrounding the active region in which the main current flows. The peripheral region is, from a viewpoint of a main current path, an inactive region, and is desired to be as narrow as possible from a viewpoint of effective use of semiconductor material. Concerning this point, Japanese Unexamined Patent Application Publication No. 2008-193043 (FIG. 5-1 and FIG. 5-2, in particular) discloses a technique in which a peripheral region comprises a plurality of p-type guard rings, first field plates composed of polysilicon, and second field plates composed of a metal film. In the structure of JP2008-193043, a contact hole for establishing the same potential value between the guard ring and the field plate is formed in the corner section of the peripheral region. As a result, a width of the straight section of the peripheral region is narrowed and the area for the active region is expanded.

A different technique concerning a peripheral region in a semiconductor device is disclosed in Japanese Unexamined Patent Application Publication No. 2009-117715 (Abstract, FIG. 1, and FIG. 3, in particular), in which a plurality of guard rings and field plates are formed in the peripheral region. The field plates of polysilicon are disposed on the surface of each guard ring at the inner and outer circumferential sides through an insulator film. A metal electrode is provided for electrically connecting the guard ring and the field plate. This structure makes it possible to narrow the gap between the field plates.

Although the MOSFET disclosed in JP2008-193043 attains high relaxation of electric field and high robustness against induces charges with a narrow width in a peripheral region, the p-type guard rings need to be formed before forming the polysilicon field plates. In case that p-type guard rings are formed after forming the polysilicon gate and polysilicon field plates, additional steps of photolithography and ion implantation are needed to form the p-type guard rings. These additional steps not only raise manufacturing costs, but also tend to create misalignment between the p-type guard ring and the polysilicon field plate, which may degrade the electric field relaxation performance and the robustness against induced charges.

JP2009-117715 discloses a device in which a region for connecting a p-type guard ring and a polysilicon field plate is formed in a ring shape, and the region for connecting the p-type guard ring and the polysilicon field plate is provided in a straight section of the peripheral region. Thus, the width in the peripheral region is relatively large.

The p-type guard ring in the JP2009-117715 is formed before forming the field plate as in the device of JP2008-193043. Therefore, the device of JP2009-117715 has the same problems as the device of JP2008-193043 mentioned above.

The present invention is directed to overcoming or at least reducing the effects of one or more of the problems set forth above.

SUMMARY OF THE INVENTION

In view of the foregoing, the invention provides a semiconductor device having a peripheral region that has a narrow width and exhibits high relaxation of electric field and high robustness against induced charges. It is another object of the present invention to provide a method of manufacturing such a semiconductor device.

The invention provides a semiconductor device having an active region for main current flow and a peripheral region surrounding the active region on a principal surface of a semiconductor substrate of a first conductivity type. The peripheral region comprises: a guard ring(s) of a second conductivity type composed of straight sections and curved sections formed in a surface region of the principal surface surrounding the active region, and a pair(s) of polysilicon field plates in a ring shape disposed separately on an inner circumferential side and an outer circumferential side of the guard ring on the guard ring via an insulation film; wherein the pair of polysilicon field plates comprises a polysilicon connection region extending from the pair of polysilicon filed plates to a place in-between at a contact hole opened in the insulation film on the surface of the guard ring in the curved section, and the polysilicon connection region is electrically connected to the guard ring in the curved section with a metal film at the contact hole.

The polysilicon connection regions extending from both polysilicon field plates towards the middle between the two field plates may be either continuous or separated although electrically connected.

A semiconductor device according to the present invention can be a device wherein the active region and the peripheral region comprise a superjunction parallel pn layer composed of p-type regions and n-type regions that are formed in a direction vertical to a principal surface of the semiconductor substrate and arranged alternately adjacent to each other in the direction along the principal surface, and the alternating conductivity type layer formed in the peripheral region is, in the first principal surface side, covered with a first conductivity type region having an impurity concentration lower than that of the alternating conductivity type layer and a depth deeper than the second conductivity type guard ring.

Preferably a width of the guard ring is larger in the curved section of the peripheral region than that in the straight section of the peripheral region. This structure decreases the width of the straight section of the peripheral region, providing an advantage of reduction in chip size.

Preferably a width of the polysilicon connection region is at most half a depth of the second conductivity type guard ring. This structure makes the guard rings in a continuous ring configuration and avoids degradation of the breakdown voltage.

A method of manufacturing the semiconductor device comprises steps of: forming the insulation film in the peripheral region; opening a window in the insulation film for forming the guard ring; forming a first insulating film at the window; forming the pair of polysilicon field plates on the insulation film in both sides of the window and simultaneously forming the polysilicon connection region on the first insulating film; forming a guard ring using the insulation film and the pair of polysilicon field plates as a mask; forming a second insulating film covering the pair of polysilicon field plates; and forming a contact hole for electrical connection by making the metal film in contact with the polysilicon connection region and the guard ring in the curved section by a process of etching the first insulating film and the second insulating film, the steps being carried out in the sequence of this listing. This method accomplishes the object of the invention.

Another method of manufacturing a semiconductor device comprises steps of: opening windows in an insulation film for forming a second conductivity base region in an active region and a second conductivity type guard ring in a peripheral region; forming a polysilicon gate electrode in the active region, a pair of polysilicon field plates separated to an inner circumferential side and an outer circumferential side in the peripheral region, and a polysilicon connection region extending from the pair of polysilicon field plates separated to the inner circumferential side and the outer circumferential side in a curved section of the peripheral region to an in-between place of the pair of field plates; forming the second conductivity type base region in the active region using the polysilicon gate electrode as a mask and the second conductivity type guard ring in the peripheral region using the insulation film as a mask; and forming a contact hole for contact of main electrode in the active region, and a contact hole for electrical connection between the polysilicon connection region and a surface of the second conductivity type guard ring by making contact with a metal film, the steps being conducted in this order. This method accomplishes the object of the invention.

The inventive semiconductor device has an active region and a peripheral region surrounding the active region. The peripheral region has a narrow width and exhibits high relaxation of electric field and high robustness against induced charges. The semiconductor device can be manufactured without additional steps of photolithography and ion implantation that would be necessary for forming the p-type guard rings before forming polysilicon field plates.

BRIEF DESCRIPTION OF THE DRAWINGS

The foregoing advantages and features of the invention will become apparent upon reference to the following detailed description and the accompanying drawings, of which:

FIGS. 1(a) and 1(b) are plan views of a vertical MOSFET of a semiconductor device of Example 1 according to the invention;

FIGS. 7(a), 7(b), and 7(c) are sectional views of a vertical MOSFET in a step of forming an oxide film to illustrate a method of manufacturing a semiconductor device according to the invention;

FIGS. 8(a), 8(b), and 8(c) are sectional views of a vertical MOSFET in a step of forming a surface n-type region to illustrate a method of manufacturing a semiconductor device according to the invention;

FIGS. 13(a), 13(b), and 13(c) are sectional views of a vertical MOSFET in a step of forming a source electrode and metal films to illustrate a method of manufacturing a semiconductor device according to the invention;

FIGS. 16(a) and 16(b) are sectional views of a curved section of an edge termination structure of a trench gate MOSFET of a semiconductor device according to the invention, in the case of a discontinued polysilicon connection region;

DETAILED DESCRIPTION OF SPECIFIC EMBODIMENTS

The following describes in detail embodiment examples of a semiconductor device according to the present invention with reference to the accompanying drawings. The present invention shall not be limited to the following description on the embodiment examples as long as the description does not exceed the spirit and scope of the invention. Although the first conductivity type is an n-type and the second conductivity type is a p-type in the following description, the description is valid if the n-type and the p-type are exchanged. The sign "+" or "−" represents that the impurity concentration is relatively high or low, respectively, in the region with the sign.

EXAMPLE 1

Figure 2:
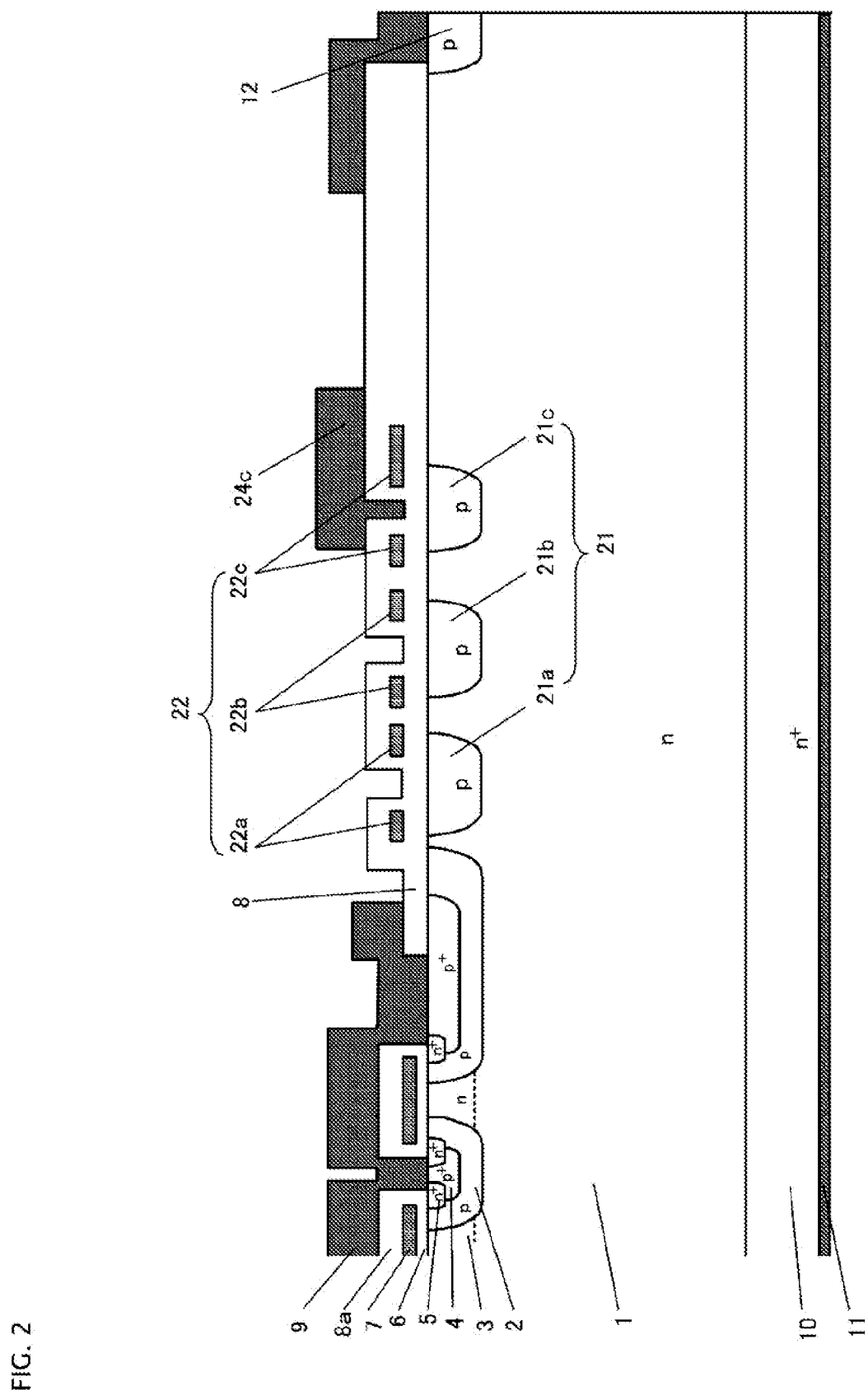
FIG. 2 is a sectional view cut along the line A-A' of the device of FIGS. 1(a) and 1(b) according to the invention.
Figure 3:
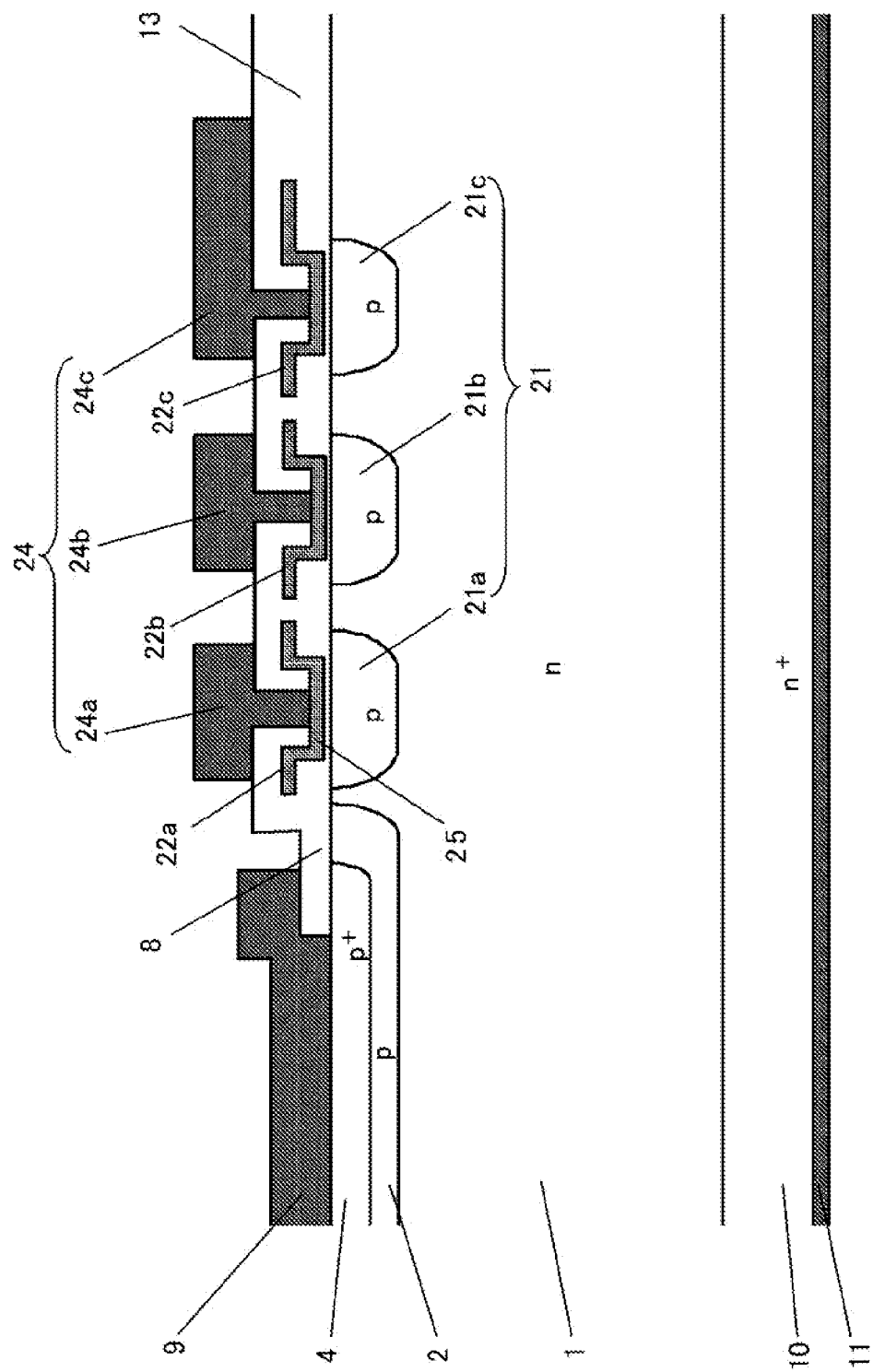
FIG. 3 is a sectional view cut along the line B-B' of the device of FIGS. 1(a) and 1(b) according to the invention.
Figure 4:
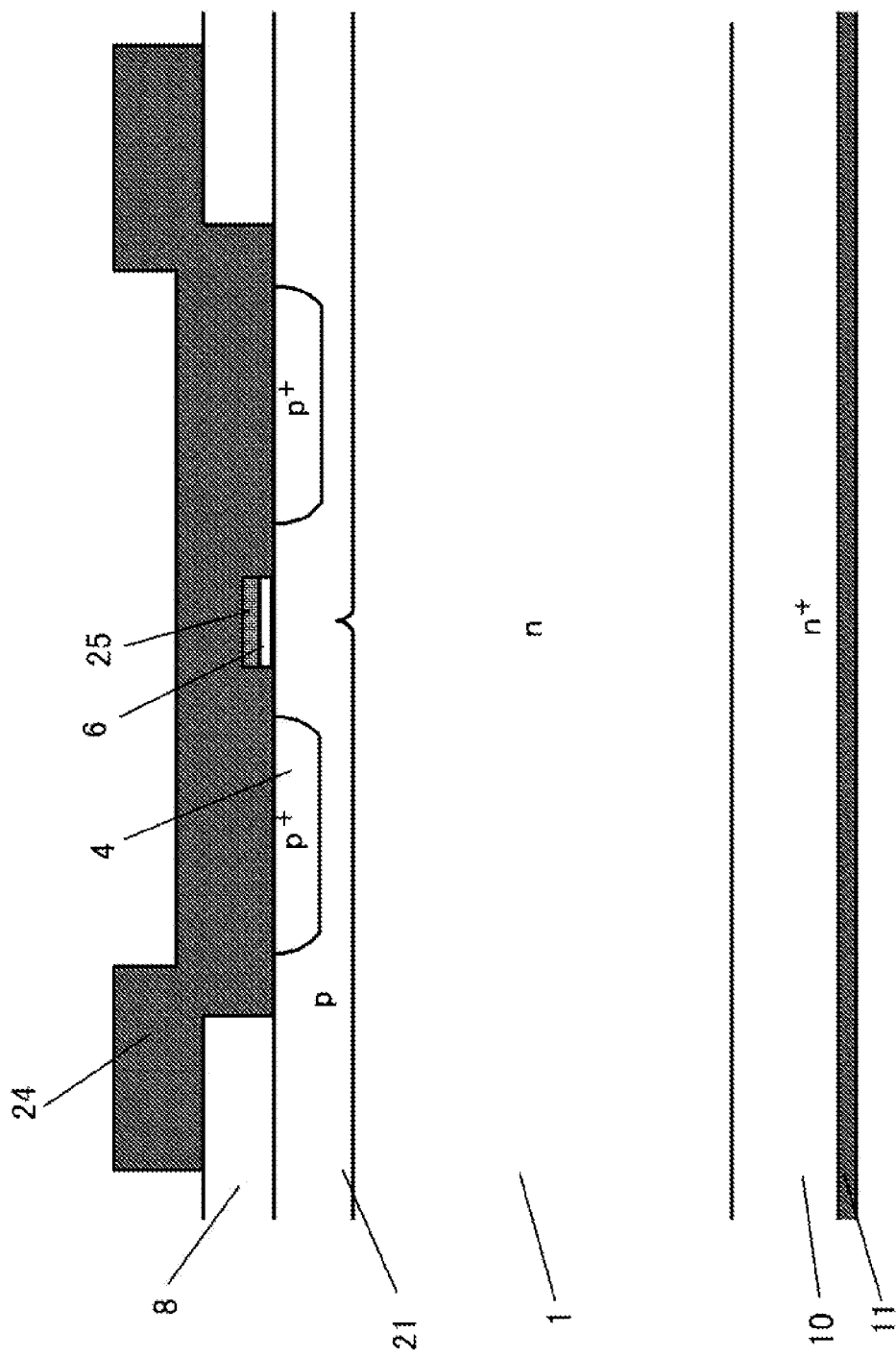
FIG. 4 is a sectional view cut along the line C-C' of the device of FIGS. 1(a) and 1(b) according to the invention.

FIG. 1(a) is a partial plan view of a planar gate type vertical MOSFET shown in FIG. 1(b) and is an enlarged view of a quarter part indicated by the dotted square in FIG. 1(b). FIGS. 2, 3, and 4 are sectional views cut along the line A-A', B-B', and C-C', respectively, in FIG. 1(a). "A planar type," a word opposite to "a trench gate type," means a gate structure in which a gate electrode is disposed on a planar front surface of a semiconductor substrate via a gate insulation film. The front surface of a semiconductor substrate is a first principal surface of a semiconductor substrate in the following description. In FIG. 1(a) indicated are: p-type base region 2 in active region 101 where the main current flows, gate electrode 7 composed of polysilicon, contact hole 26a, p-type guard ring 21 in peripheral region 102, polysilicon field plates 22a, 22b, and 22c, polysilicon connection region 25 in curved section 102b, contact hole 26b, and outermost p-type region 12. However, FIG. 1(a) omits a field insulation film, an interlayer dielectric film, a metal film, and metal electrodes, for ease of understanding the drawing. As shown in sectional view of FIG. 2, a pair of polysilicon field plates 22 (22a, 22b, or 22c) is disposed on both sides of each p-type guard ring 21 (21a, 21b, or 21c) via field oxide film 8. The field oxide film is used for a field insulation film in the following example. Polysilicon field plate 22 (22a, 22b, or 22c) is divided into two pieces on the both sides of the surface of p-type guard ring 21 (21a, 21b, or 21c) and electrically connected to p-type guard ring 21 (21a, 21b, or 21c) by contact with metal film 24 at contact hole 26b (indicated in FIG. 1(a)) provided in curved section 102b of the peripheral region. Except for the place of contact hole 26b, polysilicon field plate 22 (22a, 22b, or 22c) is electrically insulated from p-type guard ring 21 (21a, 21b, or 21c) by field oxide film 8. In order to provide contact hole 26b, a width of p-type guard ring 21 in curved section 102b (as shown in FIG. 3) is made broader than that of p-type guard ring 21 in straight section 102a (as shown in FIG. 2). Preferably, polysilicon connection region 25 is provided in curved section 102b, as shown in the sectional view of FIG. 3, in order to facilitate contact to metal film 24 (24a, 24b, or 24c) so that polysilicon field plate 22 (22a, 22b, or 22c) electrically connects to the surface of p-type guard ring 21 (21a, 21b, or 21c) through contact with metal film 24 (24a, 24b, or 24c). The sectional view of FIG. 4 (which is a sectional view along the line C-C' indicated in FIG. 1(a)) illustrates that metal film 24 is made in contact with both the surface of p-type guard ring 21 and the surface of polysilicon connection region 25 that is an extension from polysilicon field plate 22, thereby making electrical connection between p-type guard ring 21 and polysilicon field plate 22. The $p^+$-type contact region 4 shown in FIG. 4 is a $p^+$-region formed on the surface of p-type guard ring 21 for improving contact characteristic between metal film 24 and p-type guard ring 21. FIG. 4 also indicates insulation film 6 disposed between polysilicon connection region 25 and the surface of p-type guard ring 21. Insulation film 6 is formed simultaneously with the gate insulation film.

In order to form metal film 24 for electrically connecting p-type guard ring 21 and polysilicon field plate 22, an opening width necessary for the contact needs to be ensured. Nevertheless, in the straight section of p-type guard ring 21 shown in FIG. 2, which is a sectional view cut along the line A-A' in FIG. 1(a), polysilicon field plate 22 and p-type guard ring 21 are insulated by field oxide film 8 and not connected electrically. Consequently, the opening width necessary for the contact does not need to be prepared allowing a width as narrow as possible in the straight section of the peripheral region. The opening width for the contact can be reserved by widening solely the width in the curved section (FIG. 3) of the peripheral region. This configuration in the curved section of the peripheral region facilitates attainment of the common electric potential by electrical connection between polysilicon field plate 22 and p-type guard ring 21. Metal film 24c is formed in a ring configuration and has an overhanging portion projecting outer than outside polysilicon field plate 22c. The overhanging portion functions as a field plate.

With regard to the reference numerals in FIG. 2, the following gives brief description for the numerals that has not been given specific description in the preceding part of the specification. Reference numeral 1 represents an n-type drift layer, 2 is a p-type base region, 3 is a surface n-type drift region, 4 is a $p^+$-type contact region, 5 is an $n^+$-type source region, 6 is a gate insulation film, 7 is a polysilicon gate electrode, 8 is field oxide film, 8a is an interlayer dielectric film, 9 is a source electrode, 10 is an $n^+$-type semiconductor substrate, 11 is a drain electrode, and 12 represents an outermost peripheral p-type region.

Figure 14:
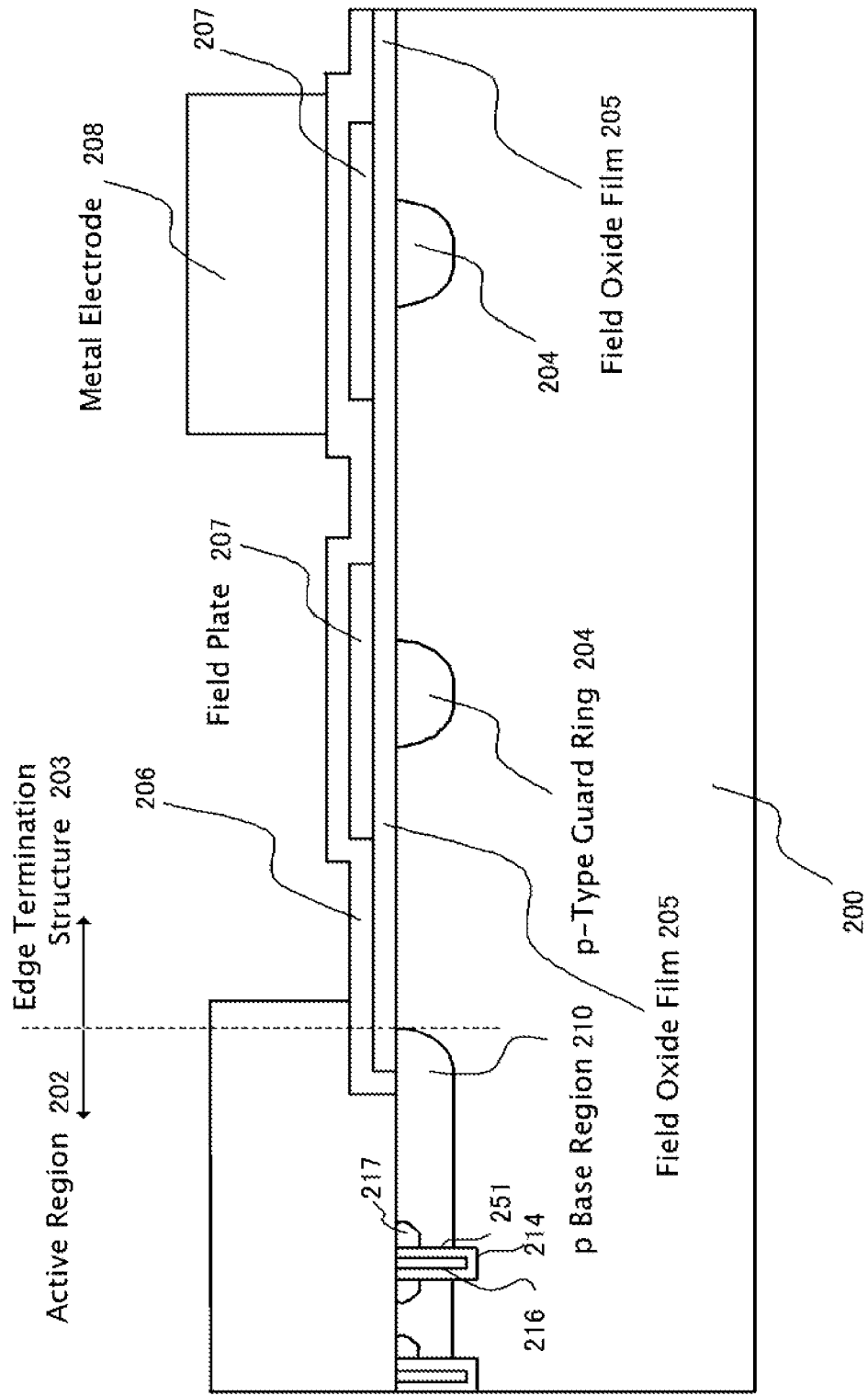
FIG. 14 is a sectional view of an edge termination structure of a trench gate MOSFET corresponding to FIG. 1 in JP2008-193043.
Figure 15:
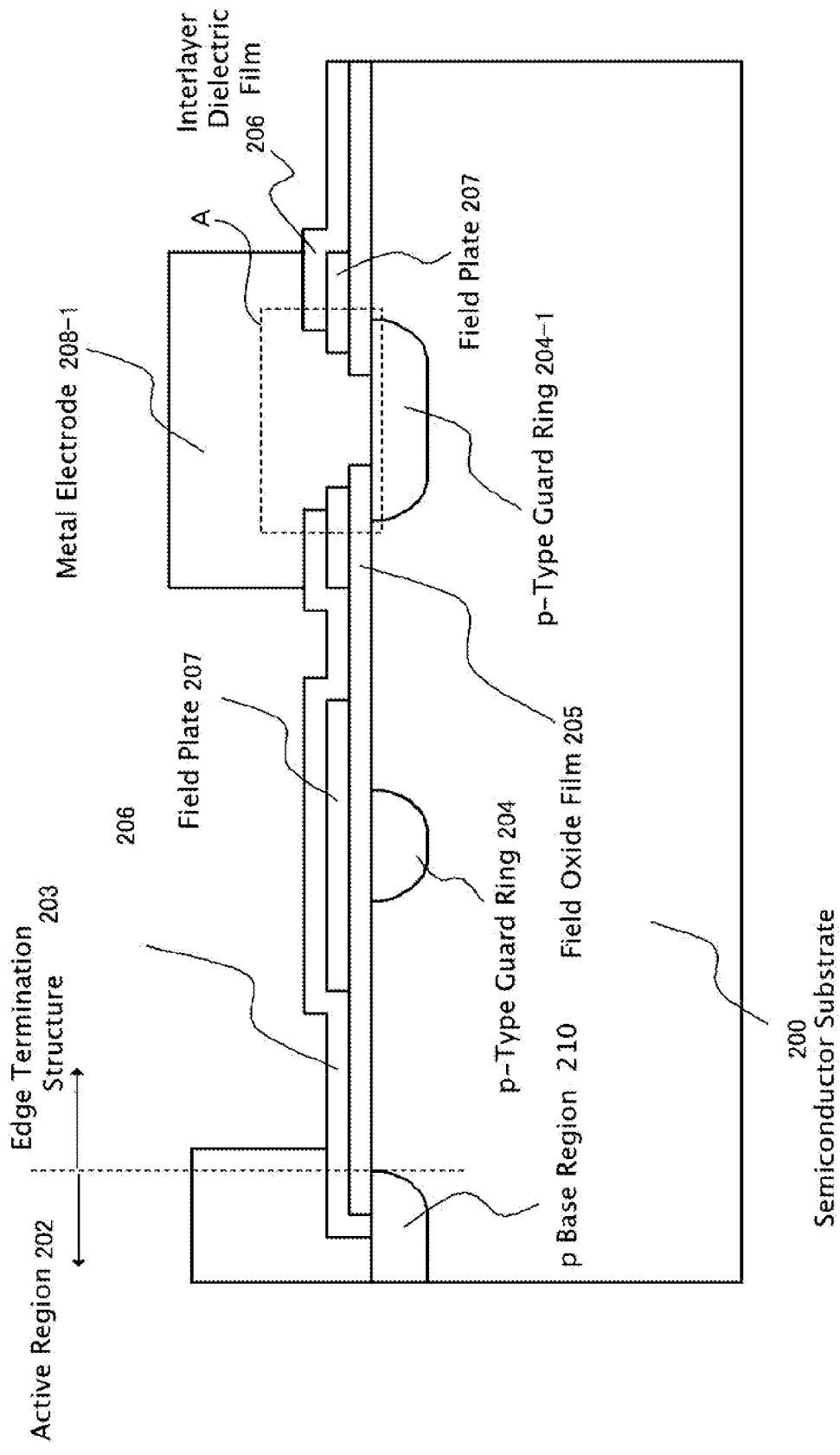
FIG. 15 is a sectional view of a curved section of an edge termination structure of a trench gate MOSFET corresponding to FIG. 2 in JP2008-193043.

The following describes differences between the MOSFET disclosed in JP2008-193043 as shown in the sectional views FIG. 1 and FIG. 2 in JP2008-193043 and the MOSFET of Example 1 according to the present invention. In the following description, FIG. 1 and FIG. 2 in JP2008-193043 are replaced by FIG. 14 and FIG. 15, respectively, of the accompanying drawings in this specification. The MOSFET disclosed in JP2008-193043 as shown in FIG. 14 comprises p-type base region 210 in active region 202 of semiconductor substrate 200. Source region 217 is formed in the surface region of p-type base region 210 and, from the surface of source region 217, trench 214 is formed. A trench gate structure is fabricated by forming gate electrode 216 in trench 214 via gate insulation film 251. Because of the trench gate structure, in the procedure for fabricating edge termination structure 203, which corresponds to the peripheral region of Example 1 of the present invention, polysilicon field plate 207 is formed after forming p-type guard ring 204. As a result, in the straight section of the edge termination structure 203, polysilicon field plate 207 is disposed covering the entire surface of p-type guard ring 204 via field oxide film 205. In the edge termination structure of JP2008-193043 as shown in the sectional view of FIG. 15, p-type guard ring 204-1 and polysilicon field plate 207 are electrically connected to attain a common electric potential. The electric connection is performed by metal electrode 208-1 filling a contact hole A that is formed from the surface of interlayer dielectric film 206 reaching the surface of p-type guard ring 204-1 at the place indicated by the dotted rectangle. If this electrical connection is formed in the straight section of edge termination structure 203, the width of the peripheral region becomes large. Accordingly, the contact hole A is not provided in the straight section, remaining narrow. In the curved section having a width enlarged by changing the curvatures, the contact hole A is formed and filled with metal electrode 208-1 to obtain electrical connection and a common electric potential.

In the planar gate structure as in the case of the MOSFET of Example 1 of the present invention, inversely to the description in JP2008-193043, p-type base region 2 (referring to FIG. 2,) is formed after forming gate electrode 7 composed of polysilicon, using polysilicon gate electrode 7 as a mask. In the peripheral region, polysilicon field plate 22 is formed simultaneously with polysilicon gate electrode 7, and p-type guard ring 21 is formed simultaneously with p-type base region 2 using field oxide film 8 as a mask. Consequently, p-type guard ring 21 is not formed right under polysilicon field plate 22 in principle. But p-type guard ring 21 can expands under polysilicon field plate 22 in a thermal diffusion process.

As a consequence, polysilicon field plate 22, which is provided for obtaining an electric field relaxation and charge resistance capability (hereinafter referred to as robustness against induced charges), is formed on thick field oxide film 8 and then, a window for ion implantation is opened and p-type guard ring 21 is formed using field oxide film 8 as a mask by means of ion implantation and thermal diffusion. As a result, polysilicon field plate 22 covers merely the inner circumferential side and outer circumferential side of the thermally diffused portion of p-type guard ring 21 in Example 1 of the invention, while in the trench gate structure of the JP2008-193043, the entire surface of p-type guard ring 204 is covered by polysilicon field plate 207. In order to ensure the electric field relaxation and the robustness against induced charges, polysilicon field plate 22 and p-type guard ring 21 need to be electrically connected to obtain a common electric potential. If a contact region for this electrical connection is formed in straight section 102a of the peripheral region, the width of the peripheral region becomes large. So the contact (electrical connection) is carried out in curved section 102b. It is a common idea in the present invention and in the description of JP2008-193043 that the electrical connection is executed in the curved section of the peripheral region for obtaining a common electric potential between polysilicon field plate 22 and p-type guard ring 21. However, actual structures for carrying out the electrical connection are different as described above. In Example 1 of the invention as shown in FIG. 3 and FIG. 4, being described here again, the surface of p-type guard ring 21 and the surface of polysilicon field plate 22 are electrically connected with each other preferably in curved section 102b by metal film 24 in contact with the two articles through polysilicon connection region 25. Here, polysilicon field plate 22 is formed separately on the inner circumferential side and the outer circumferential side of the surface of p-type guard ring 21 via field oxide film 8. Polysilicon connection region 25 drawn in FIG. 3 and FIG. 4 is a region that directly connects the parts in the inner circumferential side and the outer circumferential side of polysilicon field plate 22. Even though the inner circumferential side part and the outer circumferential side part of polysilicon field plate 22 are separated without any direct connection, there is no problem in performance of polysilicon field plate 22 when the separated parts are connected by another means for example, metal film 24. It is only necessary that the parts of the both sides of polysilicon field plate 22 are electrically connected.

FIGS. 16(a) and 16(b) are sectional views of an example of the curved section of the peripheral region in which the polysilicon connection region has a cut and not directly connected. FIG. 16(a) is a sectional view cut along the line B-B' in FIG. 1(a) and FIG. 16(b) is a sectional view cut along the line C-C' in FIG. 1(a), the latter also being a sectional view cut along the line E-E' in FIG. 16(a). Polysilicon connection region 25 without direct connection is referred to as a polysilicon extension part in the following description. The polysilicon extension parts includes, as shown in FIG. 16(a), polysilicon extension parts 27a, 27c, and 27e that are extending from inner circumferential side field plates 22a-1, 22b-1, and 22c-1 towards outer circumferential side, and polysilicon extension parts 27b, 27d, and 27f that are extending from outer circumferential side field plates 22a-2, 22b-2, and 22c-2 towards inner circumferential side. In this structure, too, electrical connection can be carried out between polysilicon extension part 27 and p-type guard ring 21 by contact with metal film 24. In this structure of FIG. 16(a), unlike polysilicon connection region 25 of FIG. 3, there is no direct connection between polysilicon extension parts 27a, 27c, and 27e, and polysilicon extension parts 27b, 27d, and 27f, respectively.

In the case where polysilicon connection region 25 is continuous between the both sides of the pair of polysilicon field plates 22 as shown in FIG. 3, in Example 1 of the invention, polysilicon connection region 25 masks the portion beneath the connection region at which a portion of the p-type guard ring is to be formed in the process of ion injection for forming p-type guard ring 21, inhibiting ion injection and formation of a continuous p-type guard ring. This place must be connected by thermal diffusion to make continuous p-type guard ring 21. Accordingly, polysilicon connection region 25 needs to have a limited width. If the p-type guard ring has a gap beneath polysilicon connection region 25, the breakdown voltage may degrade. Therefore, for obtaining a continuous p-type guard ring 21 right under polysilicon connection region 25 by thermal diffusion after ion injection, a width of polysilicon connection region 25 needs to be at most a half dimension of a depth of p-type guard ring 21. Likewise, a width of polysilicon extension 27 is preferably formed in at most half a dimension of a depth of p-type guard ring 21, as well as polysilicon connection region 25.

The width of p-type guard ring 21 is larger in curved section 102b than in the straight section of the peripheral region. This configuration has an advantage that the electric field relaxation can be performed in a small radius of curvature of p-type guard ring 21 in curved section 102b. Contact between metal film 24 and the surface of p-type guard ring 21 in contact hole 26b is implemented in a configuration of line symmetry with respect to the line of polysilicon connection region 25. As a consequence, if poor electric contact occurs due to an attached dust or the like in a part of the contact hole at one of the both sides of polysilicon connection region 25, a part of the contact hole at the other side of polysilicon connection region 25 contributes to contact between the p-type guard ring 21 and the metal film 24. Thus, Example 1 according to the invention enables not only forming polysilicon field plates 22 electrically connecting to p-type guard rings 21 without any additional process, but also ensuring an electric field relaxation and robustness against induced charges with a reduced width of a peripheral region for retaining a high breakdown voltage. The reduced width of the peripheral region is useful to expand an active region for main electric current.

Figure 9A:
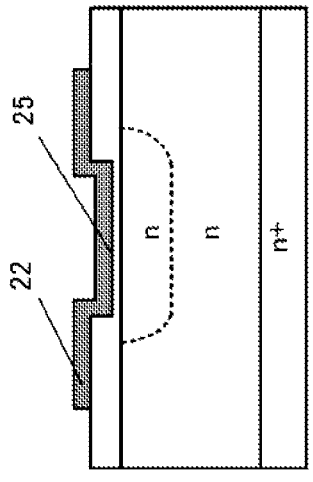
FIGS. 9(a), 9(b), and 9(c) are sectional views of a vertical MOSFET in a step of forming a gate electrode, polysilicon field plates, and a polysilicon connection region to illustrate a method of manufacturing a semiconductor device according to the invention.
Figure 9B:
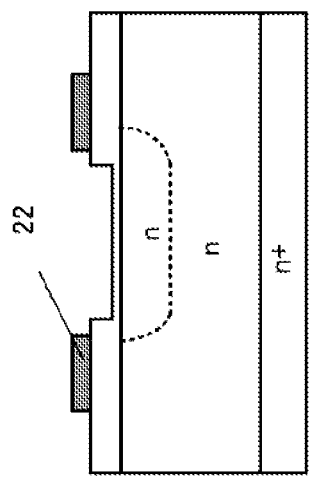
Figure 9C:
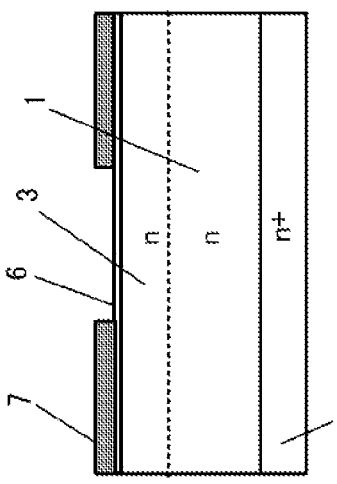

Now, a method of manufacturing the planar gate type MOSFET of Example 1 will be described in detail in the following. FIGS. 7(a), 7(b), 7(c), FIGS. 8(a), 8(b), 8(c), and FIGS. 9(a), 9(b), 9(c) are partial sectional views of a semiconductor substrate in a procedure of manufacturing the planar gate type MOSFET. FIGS. 7(a), 7(b), and 7(c) illustrate a step of forming a field oxide film; FIGS. 8(a), 8(b), and 8(c) illustrate a step of forming an n-type region; and FIGS. 9(a), 9(b), and 9(c) illustrate steps of forming a gate electrode, polysilicon field plates, and a polysilicon connection region.

FIGS. 7(a), 8(a), and 9(a) show the active region. FIGS. 7(b), 8(b), and 9(b) show the straight section 102a, which is a part of the peripheral region corresponding to the cross section A-A' in FIG. 1(a); and FIGS. 7(c), 8(c), and 9(c) show the curved section 102b, which is a part of the peripheral region corresponding to the cross section B-B' in FIG. 1(a).

N$^+$-type semiconductor substrate 10 is prepared usually using a CZ (Czochralski) crystal, and n-type epitaxial layer 1 is grown on substrate 10. Oxide film 1-1 is formed on the n-type epitaxial layer 1 by thermal oxidation. Referring to FIGS. 7(b) and 7(c), thick oxide film 1-1 is left on peripheral region 102a and 102b, and opening window 1-2 is formed on the region for forming p-type guard ring 21 by processes of patterning and etching. Then, to reduce the ON resistance, phosphorus ions are injected into the whole surface region of active region 101 to form surface n-type drift region 3 in the front surface side of active region 101 (FIG. 8(a)) At the same time, on peripheral region 102a and 102b, oxide film 1-1 works as a mask to execute phosphorus ion injection solely into the region where p-type guard ring 21 is to be formed as shown in FIGS. 8(b) and 8(c). Subsequently, gate insulation film 6 composed of a silicon oxide film is formed and a polysilicon layer is deposited. By processes of patterning and dry etching, gate electrode 7 is formed in active region 101 (FIG. 9(a)), and polysilicon field plates 22 are formed in the peripheral region (FIG. 9(b)). In curved section 102b of the peripheral region, polysilicon connection region 25 is formed (FIG. 9(c)). Since a dry etching process is used for working the polysilicon layer, dimensional accuracy of sub-micrometer is attained, which facilitates to obtain a stable breakdown voltage owing to an electric field relaxation and robustness against induced charges.

Figure 10A:
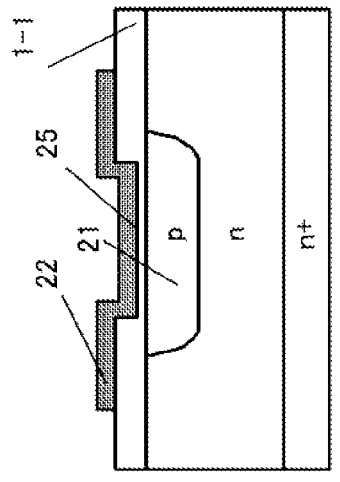
FIGS. 10(a), 10(b), and 10(c) are sectional views of a vertical MOSFET in a step of forming a p-type base region and a p-type guard ring to illustrate a method of manufacturing a semiconductor device according to the invention.
Figure 10B:
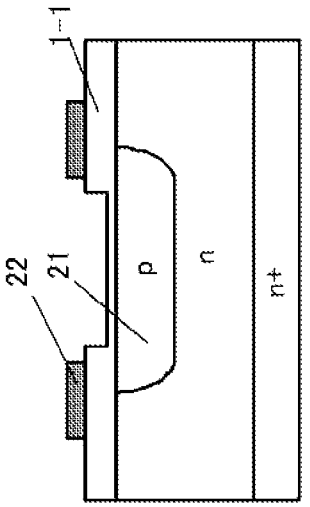
Figure 10C:
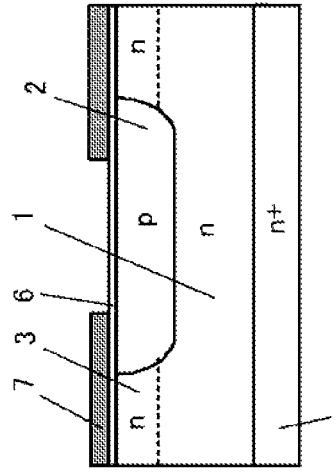
Figure 11C:
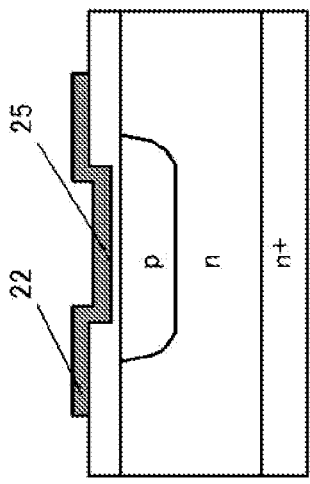
FIGS. 11(a), 11(b), and 11(c) are sectional views of a vertical MOSFET in a step of forming a MOSFET structure in the active region including a p⁺ contact region to illustrate a method of manufacturing a semiconductor device according to the invention.
Figure 11B:
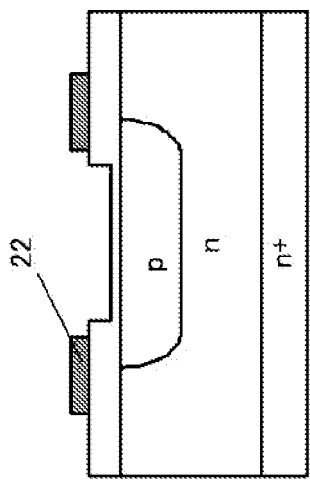
Figure 11A:
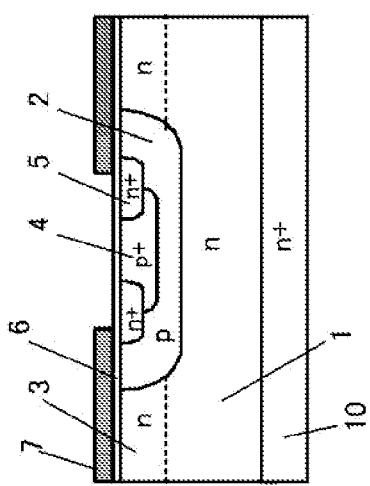
Figure 12C:
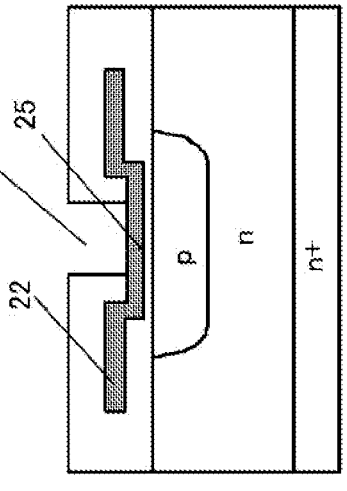
FIGS. 12(a), 12(b), and 12(c) are sectional views of a vertical MOSFET in a step of forming contact holes to illustrate a method of manufacturing a semiconductor device according to the invention.
Figure 12B:
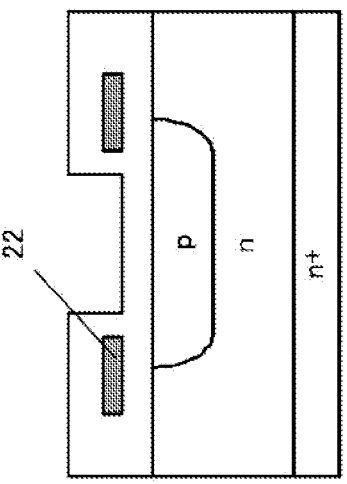
Figure 12A:
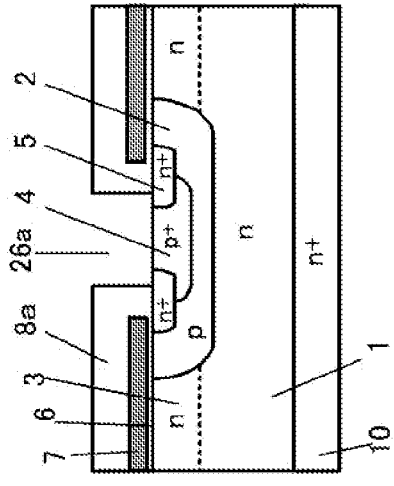

Next, FIGS. 10(a), 10(b), 10(c), FIGS. 11(a), 11(b), 11(c), and FIGS. 12(a), 12(b), 12(c) are partial sectional views of a semiconductor substrate in a procedure of manufacturing the planar gate type MOSFET. FIGS. 10(a), 10(b), and 10(c) illustrate steps of forming a p-type base region 2 and a p-type guard ring 21; FIGS. 11(a), 11(b), and 11(c) illustrate steps of forming a MOSFET structure in the active region including a p$^+$-type contact region; and FIGS. 12(a), 12(b), and 12(c) illustrate a step of forming contact holes. Referring to FIGS. 10(a), 10(b), and 10(c), p-type base region 2 and p-type guard ring 21 are simultaneously formed by the processes of boron ion injection and followed thermal diffusion. P-type base region 2 is formed in active region 101 using gate electrode 7 of polysilicon as a mask; p-type guard ring 21 is formed in straight section 102a and curved section 102b of the peripheral region using oxide film 1-1 as a mask. Since p-type guard ring 21 is formed in a self aligning manner with polysilicon field plate 22, high dimensional accuracy is achieved, which enable reduction in the widths in straight section 102a and curved sections 102b of the peripheral region.

Subsequently in active region 101 as shown in FIG. 11(a), p$^+$-type contact region 4 is formed by ion implantation of boron using a resist mask (not shown in the figure) in a predetermined place and followed thermal diffusion. Likewise, n$^+$-type source region 5 is formed by ion implantation of arsenic using a resist mask in a predetermined place. In these processes, straight section 102a and curved section 102b of the peripheral region are covered by a resist (not shown in the figure) so that the boron and arsenic ions are not introduced in the peripheral region.

After that as shown in FIG. 12(a), interlayer dielectric film 8a is deposited by CVD (chemical vapor deposition) and then, contact hole 26a is formed in active region 101 by a process of patterning. In the peripheral region as shown in FIGS. 12(b) and 12(c), the straight section is not provided with a contact hole and the curved section is provided with contact hole 26b partly opened on the surface (not shown in the figure) of the p-type guard ring and on the surface of the polysilicon connection region.

After forming the openings, referring to FIGS. 13(a), 13(b), and 13(c), a metal such as Al—Si is deposited and adhered by a process of sputtering and the deposited metal film is processed by wet etching to form a source electrode 9. At the same time in this process, metal film 24 is formed in the peripheral region, metal film 24 being provided for electrical conductive connection to achieve equipotential between the p-type guard ring and a polysilicon field plate in curved section 102b (FIG. 4). Thereafter, a passivation film is formed for front surface protection and a backside surface electrode is formed by evaporation or sputtering. Thus, a vertical type MOSFET of Example 1 is completed.

In the MOSFET of Example 1 according to the invention, as described referring to FIGS. 9(a), 9(b), 9(c) and FIGS. 10(a), 10(b), 10(c), gate electrode 7 in active region 101 and the polysilicon field plate 22 in the peripheral region are formed in advance, and thereafter, p-type base region 2 and p-type guard ring 21 are formed simultaneously using gate electrode 7 and the thick field oxide film in the peripheral region as masks. This is a point deferent from the method of manufacturing a MOSFET disclosed in JP2008-193043. Because of the difference in the sequence of manufacturing steps, the manufacturing method in Example 1 is different in the step for electrical conductive connection between the surface of p-type guard ring 21 and the surface of polysilicon field plate 22 with metal film 24.

Although the description so far is made on a MOSFET, the same effect of the invention is available in an IGBT composed by forming a p$^+$ layer between n$^+$ type semiconductor substrate 10 and drain electrode 11, and configured with a collector of this p$^+$ layer and an emitter of n$^+$ source region 5.

Figure 17:
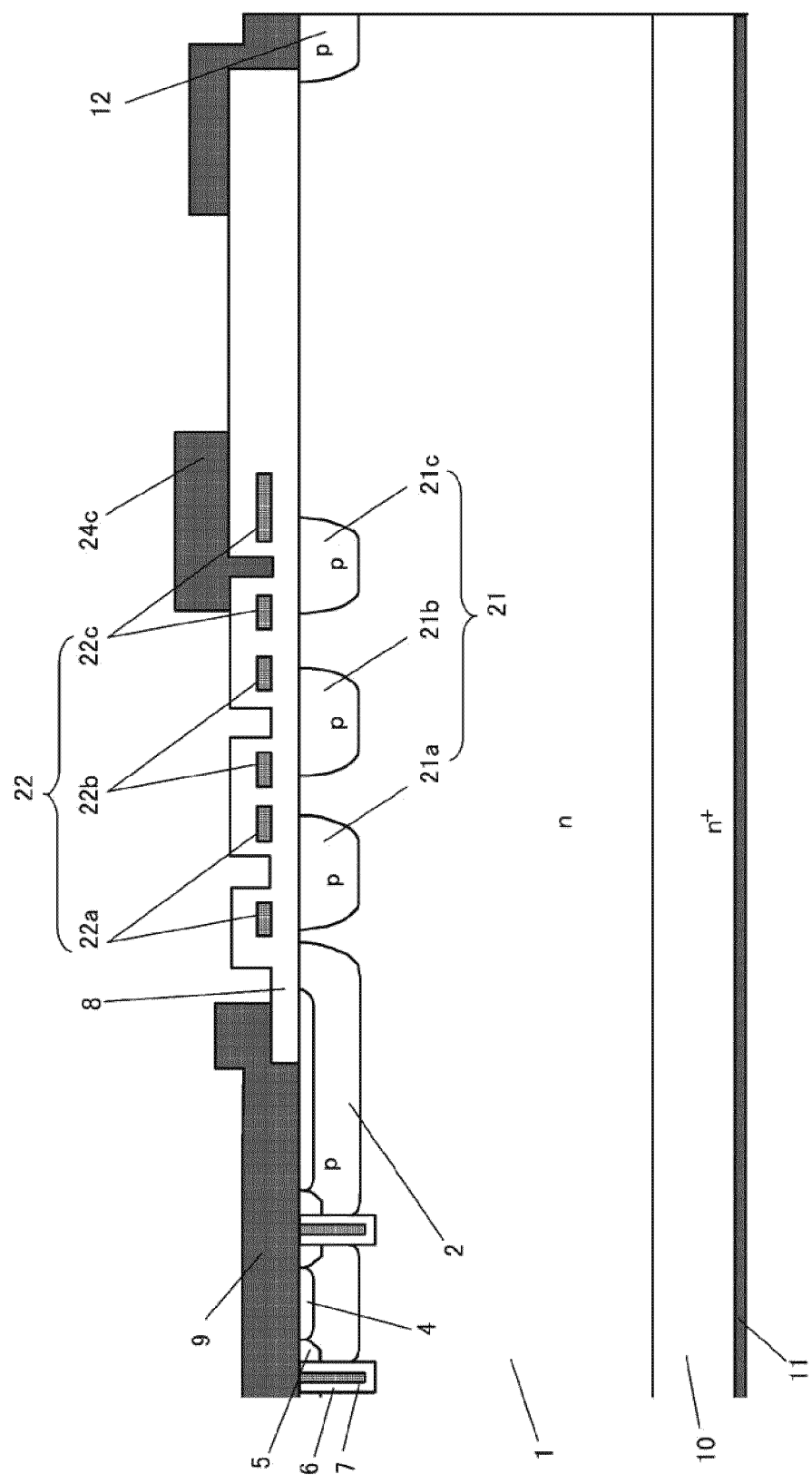
FIG. 17 is a sectional view of a MOSFET in which the active region as shown in FIG. 2 has been changed to a trench gate type.

FIG. 17 is a sectional view of a MOSFET in which the active region in FIG. 2 is changed to a trench gate type. The present invention can be applied to a trench gate type MOSFET as shown in FIG. 17. In the case where p-type base region 2 is formed after embedding the polysilicon gate electrode in the trench, in particular, the same effects as described above can be obtained. The invention can be applied to a trench gate type IGBT comprising a collector of a p$^+$ layer that is formed between n$^+$ type semiconductor substrate 10 and drain electrode 11 of FIG. 17, and an emitter of n$^+$ source region 5 of the trench gate type MOSFET.

Figure 18:
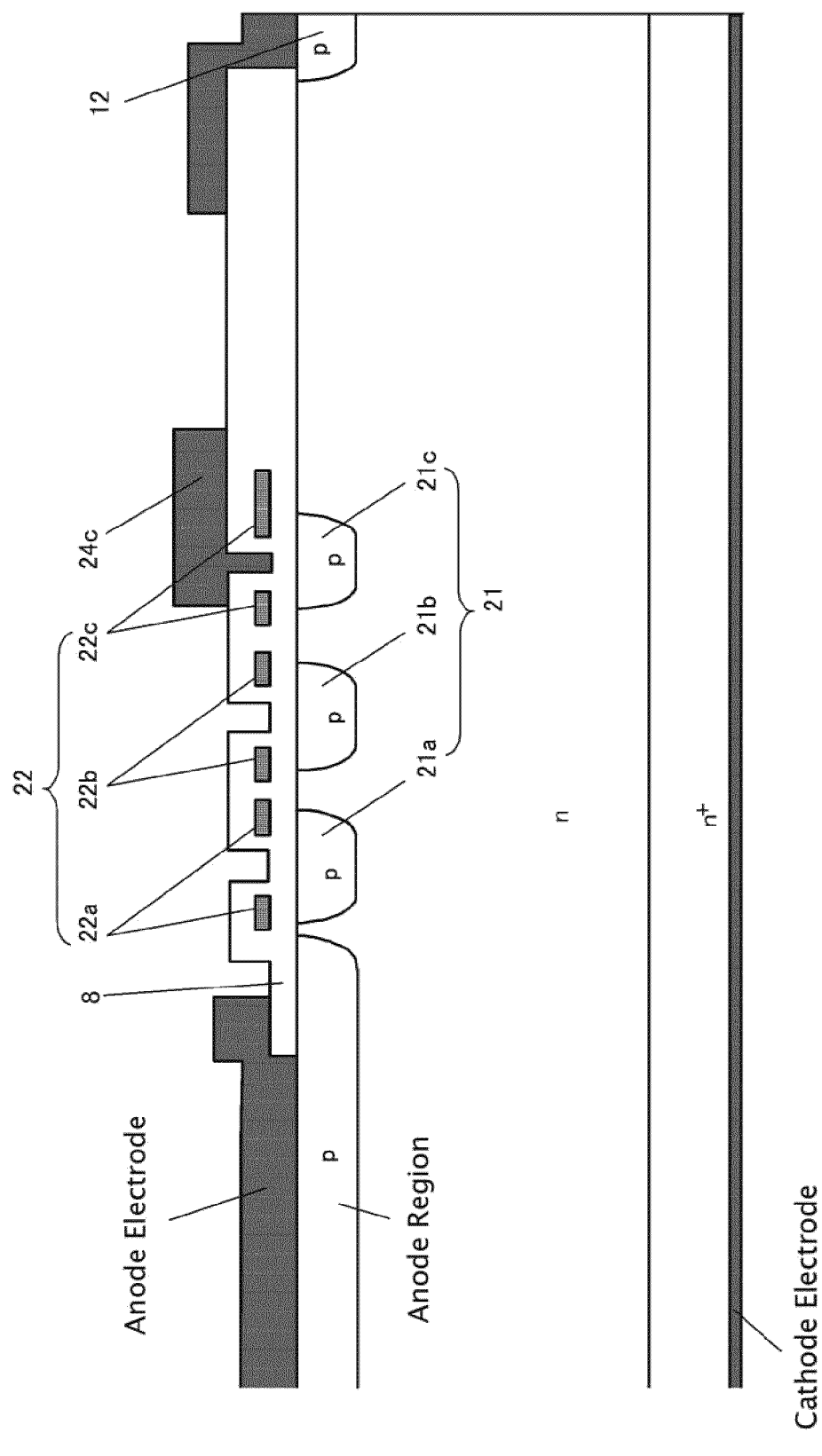
FIG. 18 is a sectional view of a semiconductor device in which the active region as shown in FIG. 2 has been changed to a diode.

FIG. 18 is a sectional view of a semiconductor device in which the MOSFET in the active region in FIG. 2 is replaced by a diode. The present invention can be applied to such a device that does not have a polysilicon film in the active region but has a guard ring in the peripheral region. In this configuration, too, an area of the peripheral region can be reduced by electric conductive connection between the guard ring and the polysilicon field plate via a metal film in the curved section of the peripheral region.

EXAMPLE 2

Figure 5:
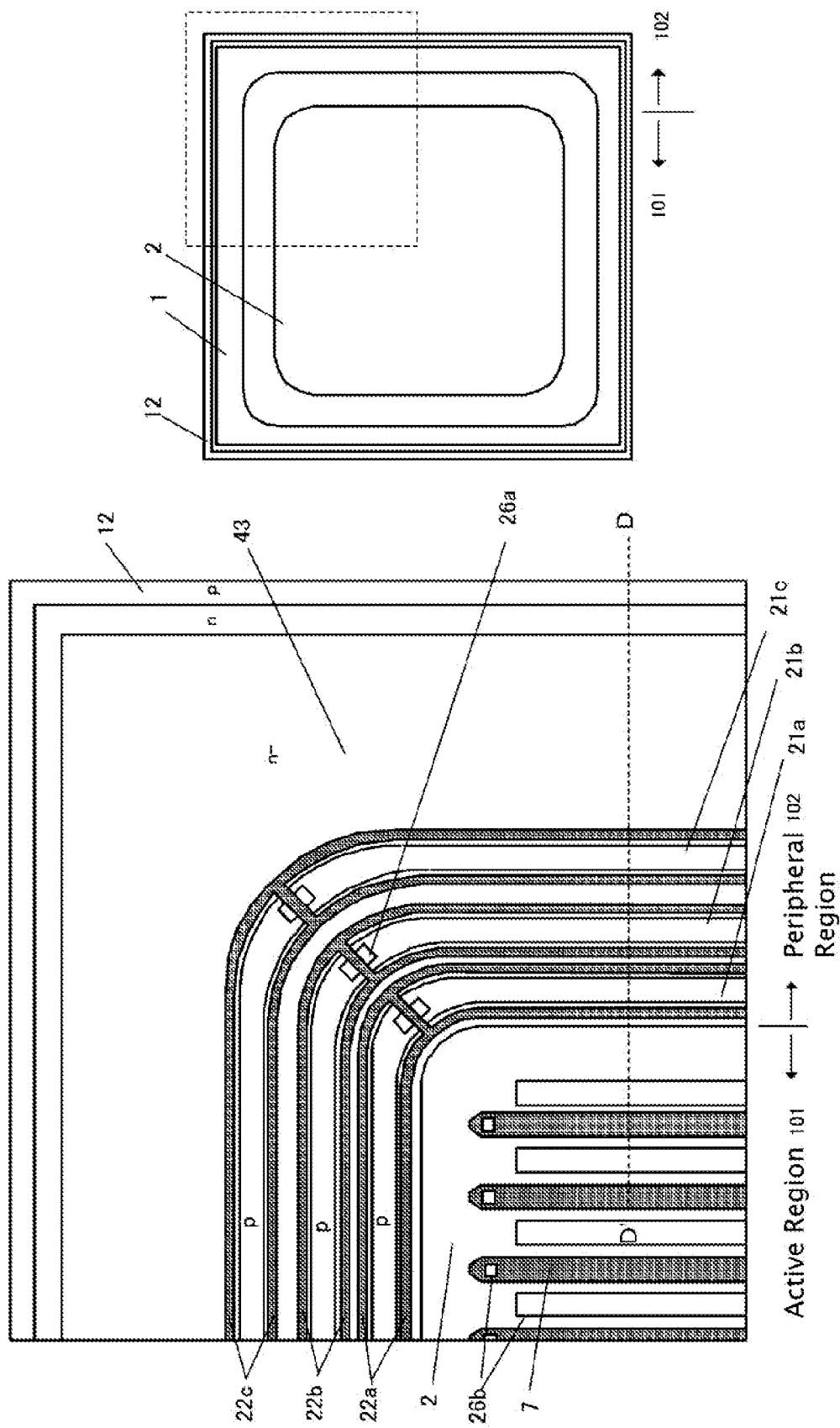
FIGS. 5(a) and 5(b) are plan views of a vertical MOSFET of a semiconductor device of Example 2 according to the invention.
Figure 6:
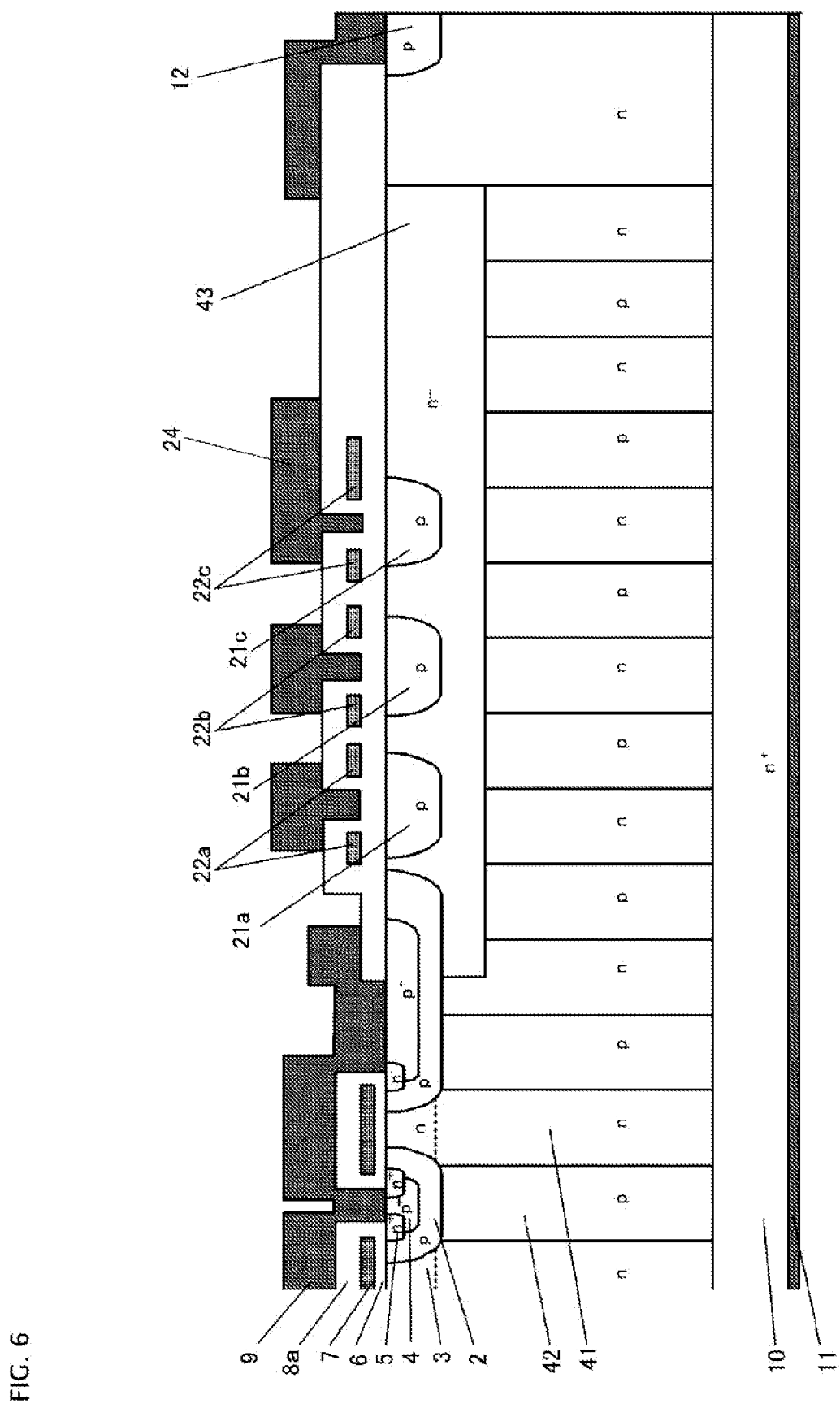
FIG. 6 is a sectional view cut along the line D-D' of the device of FIGS. 5(a) and 5(b) according to the invention.

FIGS. 5(a) and 5(b) are plan views of a planar gate type superjunction MOSFET of Example 2 distinct from Example 1, in which FIG. 5(a) is an enlarged view of the part indicated by dotted rectangle of FIG. 5(b), which shows the whole devise. FIG. 6 is a sectional view cut along the line D-D' in FIG. 5(a). The same symbols in FIG. 6 as the symbols in FIG. 2 represent the parts of the similar function.

The vertical MOSFET of Example 2 is different from the vertical MOSFET of Example 1 in that the impurity concentration profile in the n-type drift region in Example 2 is composed of a so-called alternating conductive type layer that comprises p-type regions 42 and n-type regions 41 formed in the direction vertical to the principal surface and arranged alternately in the direction parallel to the principal surface. Other different points exist in the peripheral region in that n-type low impurity concentration region 43 is provided in the front surface side of the alternating conductive type layer in the peripheral region and that metal films 24 are provided on all p-type guard rings 21a, 21b, and 21c. P-type guard rings 21a, 21b, and 21c formed in the n-type low impurity concentration region 43 in Example 2, having the same function as p-type guard rings 21 in Example 1, provide the same effects as in Example 1. For example, polysilicon field plates that are electric conductively connected to p-type guard rings 21a, 21b, and 21c can be formed without additional processing step in Example 2 like in the Example 1, and a width of the peripheral region for ensuring a high breakdown voltage can be reduced while retaining an electric field relaxation and robustness against induced charges. The width reduction in peripheral region allows the active region for main current flow to expand. For a semiconductor device with the same current capacity, a chip size can be decreased. By forming metal films 24 on all p-type guard rings 21a, 21b, 21c, the robustness against induced charges is further improved. In the structure of Example 1, too, metal film 24 may be formed on every p-type guard ring 21.

The present invention, as described thus far on a MOSFET device with a planar gate structure of Examples 1 and 2, provides a semiconductor device and manufacturing method thereof in which a chip size is reduced owing to a narrowed width of the peripheral region, and the peripheral region exhibits good electric field relaxation and high robustness against induced charges without additional step of photolithography and ion implantation for forming p-type guard rings. The present invention can be applied not only to MOSFETs as described in Examples 1 and 2, but also to any high voltage power semiconductor devices with an edge termination structure having a guard ring structure and a field plate structure. The effects of the invention can be obtained in such power semiconductor devices including IGBTs, bipolar transistors, FWDs (free wheeling diodes), and Schottky diodes.

Thus, a semiconductor device and a method of manufacturing have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on, and claims priority to, Japanese Patent Applications No. 2010-034602, filed on Feb. 19, 2010. The disclosure of the priority application in its entirety, including the drawings, claims, and the specification thereof, is incorporated herein by reference.

DESCRIPTION OF SYMBOLS 1-1: oxide film
1-2: opening window
1: n type drift layer
2: p type base region
3: surface n-type drift region
4: $p^+$ contact region
5: $n^+$ source region
6: gate insulation film
7: gate electrode, polysilicon gate electrode
8: field oxide film
8a: interlayer dielectric film
9: source electrode
10: $n^+$ semiconductor substrate
11: drain electrode
12: outermost peripheral p-type region
21, 21a, 21b, 21c: p-type guard ring
22, 22a, 22b, 22c: polysilicon field plate
22a-1, 22b-1, 22c-1: polysilicon field plate
24, 24a, 24b, 24c: metal film
25: polysilicon connection region
26a, 26b: contact hole
27, 27a, 27b, 27c: polysilicon extension
27d, 27e, 27f: polysilicon extension
41: n-type drift region
42: p-type region
43: n-type low impurity concentration region
101: active region
102: peripheral region
102a: straight section
102b: curved section

What is claimed is:

1. A semiconductor device having an active region for main current flow and a peripheral region surrounding the active region on a principal surface of a semiconductor substrate of a first conductivity type, the peripheral region comprising:
   at least one guard ring of a second conductivity type composed of straight sections and curved sections formed in a surface region of the principal surface surrounding the active region, and
   a pair of polysilicon field plates in a ring shape, disposed separately on an inner circumferential side and an outer circumferential side of the guard ring, with an insulation film between the pair of field plates and the guard ring;
   a polysilicon connection region extending between the pair of polysilicon field plates at a contact hole opened in the insulation film on the surface of the guard ring in the curved section; and
   a metal film in the contact hole for electrically connecting the guard ring with the polysilicon connection region.

2. The semiconductor device according to claim 1, wherein the polysilicon connection region is continuous.

3. The semiconductor device according to claim 2, wherein the active region and the peripheral region comprise regions of alternating conductivity type layers composed of p-type regions and n-type regions that are formed in a direction vertical to a principal surface of the semiconductor substrate and arranged alternately adjacent to each other in the direction along the principal surface, and the alternating conductivity type layer formed in the peripheral region is, in the first principal surface side, covered with a first conductivity type region having an impurity concentration lower than that of the alternating conductivity type layer and a depth deeper than that of the second conductivity type guard ring.

4. The semiconductor device according to claim 2, wherein a width of the guard ring is larger in the curved section of the peripheral region than in the straight section of the peripheral region.

5. The semiconductor device according to claim 4, wherein a width dimension of the polysilicon connection region is at most half a depth dimension of the second conductivity type guard ring.

6. The semiconductor device according to claim 2, comprising a plurality of guard rings.

7. The semiconductor device according to claim 1, wherein the polysilicon connection region is separated with a gap.

8. The semiconductor device according to claim 7, wherein the active region and the peripheral region comprise regions of alternating conductivity type layers composed of p-type regions and n-type regions that are formed in a direction vertical to a principal surface of the semiconductor substrate and arranged alternately adjacent to each other in the direction along the principal surface, and the alternating conductivity type layer formed in the peripheral region is, in the first principal surface side, covered with a first conductivity type region having an impurity concentration lower than that of the alternating conductivity type layer and a depth deeper than that of the second conductivity type guard ring.

9. The semiconductor device according to claim 7, wherein a width of the guard ring is larger in the curved section of the peripheral region than in the straight section of the peripheral region.

10. The semiconductor device according to claim 9, wherein a width dimension of the polysilicon connection region is at most half a depth dimension of the second conductivity type guard ring.

11. The semiconductor device according to claim 7, comprising a plurality of guard rings.

12. The semiconductor device according to claim 1, wherein the active region and the peripheral region comprise regions of alternating conductivity type layers composed of p-type regions and n-type regions that are formed in a direction vertical to a principal surface of the semiconductor substrate and arranged alternately adjacent to each other in the direction along the principal surface, and the alternating conductivity type layer formed in the peripheral region is, in the first principal surface side, covered with a first conductivity type region having an impurity concentration lower than that of the alternating conductivity type layer and a depth deeper than that of the second conductivity type guard ring.

13. The semiconductor device according to claim 1, wherein a width of the guard ring is larger in the curved section of the peripheral region than in the straight section of the peripheral region.

14. The semiconductor device according to claim 13, wherein a width dimension of the polysilicon connection region is at most half a depth dimension of the second conductivity type guard ring.

15. The semiconductor device according to claim 1, comprising a plurality of guard rings.

16. The semiconductor device according to claim 1, comprising a plurality of guard rings.

17. A method of manufacturing the semiconductor device as defined in claim 1, the method comprising, in order, the steps of:
   forming the insulation film in the peripheral region;
   opening a window in the insulation film for forming the guard ring;
   forming a first insulating film at the window;
   forming the pair of polysilicon field plates on the insulation film in both sides of the window and simultaneously forming the polysilicon connection region on the first insulating film;
   forming a guard ring using the insulation film and the pair of polysilicon field plates as a mask;
   forming a second insulating film covering the pair of polysilicon field plates; and
   forming a contact hole for electrical connection with a metal film in contact with the polysilicon connection region and the guard ring in the curved section by a process of etching the first insulating film and the second insulating film.

18. A method of manufacturing a semiconductor device comprising, in order, the steps of:
   opening windows in an insulation film for forming a second conductivity base region in a active region and a second conductivity type guard ring in a peripheral region;
   forming a polysilicon gate electrode in the active region, a pair of polysilicon field plates separated to an inner circumferential side and an outer circumferential side in the peripheral region, and a polysilicon connection region extending from the pair of polysilicon field plates separated to the inner circumferential side and the outer circumferential side in a curved section of the peripheral region to a point in-between the pair of field plates;
   forming the second conductivity type base region in the active region using the polysilicon gate electrode as a mask and the second conductivity type guard ring in the peripheral region using the insulation film as a mask; and
   forming a contact hole to contact a main electrode in the active region, and a contact hole for electrical connection with a metal film between the polysilicon connection region and a surface of the second conductivity type guard ring.

* * * * *